United States Patent
Kishi et al.

(10) Patent No.: US 7,781,245 B2
(45) Date of Patent: Aug. 24, 2010

(54) METHOD TO FABRICATE SEMICONDUCTOR OPTICAL DEVICE

(75) Inventors: Takeshi Kishi, Yokohama (JP); Tetsuya Hattori, Yokohama (JP); Kazunori Fujimoto, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 12/318,701

(22) Filed: Jan. 6, 2009

(65) Prior Publication Data

US 2009/0209055 A1 Aug. 20, 2009

(30) Foreign Application Priority Data

Jan. 8, 2008 (JP) .............................. 2008-001438

(51) Int. Cl.
- *H01L 21/00* (2006.01)
- *H01L 21/20* (2006.01)
- *H01L 21/36* (2006.01)
- *H01L 21/28* (2006.01)
- *H01L 21/3205* (2006.01)
- *H01L 43/12* (2006.01)
- *H01L 33/00* (2010.01)

(52) U.S. Cl. .................. 438/41; 438/44; 438/483; 438/604; 257/E33.006; 257/E33.032

(58) Field of Classification Search ............. 438/38–39, 438/41, 44, 46–47, 483, 604; 257/E33.006, 257/E33.032

See application file for complete search history.

(56) References Cited

U.S. PATENT DOCUMENTS

| | | | |
|---|---|---|---|
| 4,566,171 A * | 1/1986 | Nelson et al. .................. 438/40 |
| 4,956,320 A * | 9/1990 | Asakura et al. ............. 501/137 |
| 5,721,751 A | 2/1998 | Itaya et al. |
| 6,919,260 B1 * | 7/2005 | Umezawa et al. ........... 438/438 |
| 2008/0277686 A1 * | 11/2008 | Tsai ........................... 257/103 |

* cited by examiner

*Primary Examiner*—Savitri Mulpuri
*Assistant Examiner*—Calvin Choi
(74) *Attorney, Agent, or Firm*—Smith, Gambrell & Russell, LLP

(57) ABSTRACT

A process for the semiconductor laser diode is disclosed, which prevents the abnormal growth occurred at the second growth for the burying region of the buried hetero structure. The ICP (Induction-Coupled Plasma) CVD apparatus forms a silicon oxide file with a thickness of above 2 μm as adjusting the bias power $P_{BIAS}$. Patterning the silicon oxide mask and dry-etching the semiconductor layers, a mesa structure including the active layer may be formed. As leaving the patterned silicon oxide film, the second growth for the burying region buries the mesa structure. The residual stress of the silicon oxide film is −250 to −150 MPa at a room temperature, while, it is −200 to 100 MPa at temperatures from 500 to 700° C.

7 Claims, 6 Drawing Sheets

METHOD TO FABRICATE SEMICONDUCTOR OPTICAL DEVICE

BACKGROUND OF THE INVENTION

Field of the Invention

The present invention relates to a method to fabricate a semiconductor optical device.

The U.S. Pat. No. 5,721,751; Itaya et al., has disclosed a semiconductor laser diode including, on a n-type semiconductor substrate, an n-type buffer layer, a strained quantum well active layer, a p-type cladding layer, a first electrode, and a second electrode. To form a mesa structure including the semiconductor layers above mentioned and to grow a burying region so as to bury the mesa structure, a mask of silicon oxide, $SiO_2$, is deposited by the sputtering. The mesa is dry-etched by the reactive ion etching technique using a reaction gas containing ethane and hydrogen. The height of the mesa was around 2.7 μm. The burying region made of iron doped InP, Fe—InP, showing a semi-insulating characteristic is grown so as to bury the mesa. Thus, Itaya et al. has disclosed a semiconductor laser diode with a buried hetero-structure and a less device resistance able to be modulated in high frequencies.

Itaya carried out the second growth of the burying region to bury the mesa structure using the $SiO_2$ mask with a thickness of 0.1 μm. The height of the mesa, equivalently the depth of the burying region, preferably needs to be thicker than 3 μm, because a thinner burying region results in a substantial magnitude of the leak current flowing through the burying region. The mesa structure ordinarily includes an active layer with a thickness of around 0.2 μm, a p-type cladding layer with a thickness of around 1.5 μm, and a p-type contact layer with a thickness of around 0.2 μm. A sum of these layers becomes less than a thickness necessary to secure the enough resistance in the burying region. Accordingly, the process for the semiconductor laser ordinarily performs the excess etching of the substrate by at least 1.5 μm in the formation of the mesa.

Such a mesa structure with a substantial height inevitably accompanies with a subject, that is, an abnormal growth during the second growth for the burying region is caused on the $SiO_2$ mask with the thickness of around 0.1 μm. The reason of the abnormal growth on the mask relates to a thickness of the silicon oxide mask, $SiO_2$. It was understand that a thinner mask increased the frequency to cause the abnormal growth on the mask. However, a thicker film of the inorganic material is ordinarily attributed with a large stress due to the difference of the thermal expansion coefficient between the inorganic film and the semiconductor material underneath the film, which results in the peeling and the cracking of the silicon oxide mask.

SUMMARY OF THE INVENTION

Inventors has observed that the abnormal grown on the silicon oxide mask during the second growth for the burying region may be suppressed by using a thicker mask. Conventional process has used a silicon oxide mask with a thickness of 0.1 to 0.2 μm, while, the inventors has found that a silicon mask thicker than 0.7 μm may substantially prevent the abnormal growth. However, conventional methods to form a silicon oxide film, such as sputtering or plasma enhanced chemical vapor deposition (p-CVD), is hard to form the film in the first place because a large residual stress that results in the cracking and the peeling of the film is usually induced within the film. Even when the conventional method may form the thicker silicon oxide film on the semiconductor substrate, the cracking or the pealing of the film occurs when the substrate is set under a high temperature from 500 to 700° C., under which the second growth for the burying region is carried out, by the difference of the thermal expansion co-efficient between the film and the substrate becomes strengthened. According to further experiment by the inventors, the thicker silicon oxide film may be obtained by selecting silicon organic material such as tetra-eth-oxy-silane (TEOS) as a source material, and the residual stress induced in the film may be adjustable by varying the process conditions.

One aspect of the present invention relates to a method to form a semiconductor optical device, in particular, the method relates to form a semiconductor laser diode. The method includes steps of: (a) growing a stack including a plurality of semiconductors on a semiconductor substrate, (b) forming a silicon oxide film on the stack with a thickness greater than 2 μm, (c) patterning the silicon oxide film, (d) dry-etching the stack with the patterned silicon oxide film as an etching mask to form a mesa structure, and (e) growing a burying region so as to bury the mesa structure. The feature of the present process is that the silicon oxide film formed on the semiconductor stack has a stress in a room temperature from −250 to −150 MPa.

Further feature of the invention is that the silicon oxide film formed on the semiconductor stack preferably has a stress of −200 to 100 MPa at a temperature from 500 to 700° C., which is a process temperature in the second growth for the burying region, and preferably has a positive temperature co-efficient of the stress in a range from the room temperature to the process temperature in the second growth.

The stack preferably has a thickness greater than 1.5 μm and the dry-etching to form the mesa structure preferably etches the substrate at least 2 μm in substantially perpendicular to the primary surface of the substrate. The present process may form the relatively thicker burying region to reduce a leak current flowing in the burying region.

The method of the present invention may use the induction-coupling plasma enhanced chemical vapor deposition (ICP-CVD) apparatus for forming the silicon oxide film on the semiconductor stack. Moreover, the method may vary the bias power applied to the semiconductor substrate to adjust the residual stress in the silicon oxide film. The source gas in the ICP-CVD technique may be silicon organic material such as tetra-eth-oxy-silane (TEOS) and oxygen.

The step to form the stack may include a sequential growth of an InP layer with the first conduction type, an active layer, an InP layer with the second conduction type, an InGaAs layer with the second conduction type, and an InP cap layer. The step to form the mesa may include a sequential etch of the InP cap layer, the InGaAs layer, the InP layer with the second conduction type, the active layer, the InP with the first conduction type. The method may further include a step to remove the patterned silicon oxide film and the InP cap layer after the growth of the burying region to expose the InGaAs layer with the second conduction type, and a step to form an electrode on the exposed InGaAs layer with the second conduction type. Moreover, the burying region may be iron doped InP (Fe—InP).

DESCRIPTION OF PREFERRED EMBODIMENTS

The present invention will be easily understood through the description below as referring to the accompanying drawings. Next, a method to form a semiconductor optical device according to the present invention will be described. In the description of the drawings, the same numerals or the same symbols will refer to the same elements without overlapping explanations.

Figure 1A:
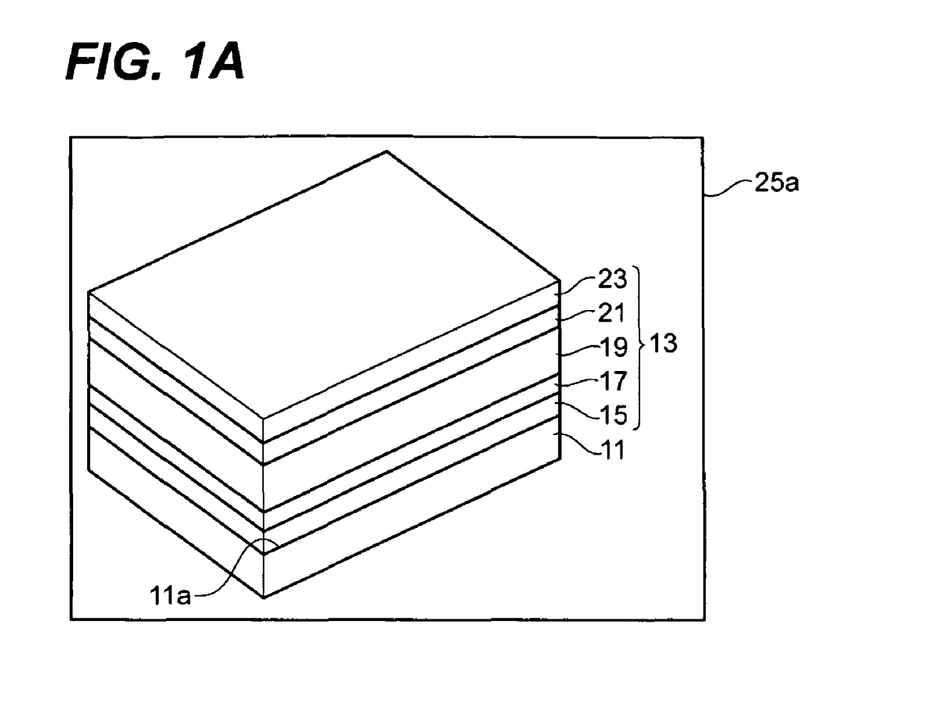
FIG. 1A shows a process to grow semiconductor layers on a semiconductor substrate epitaxially.
Figure 1B:
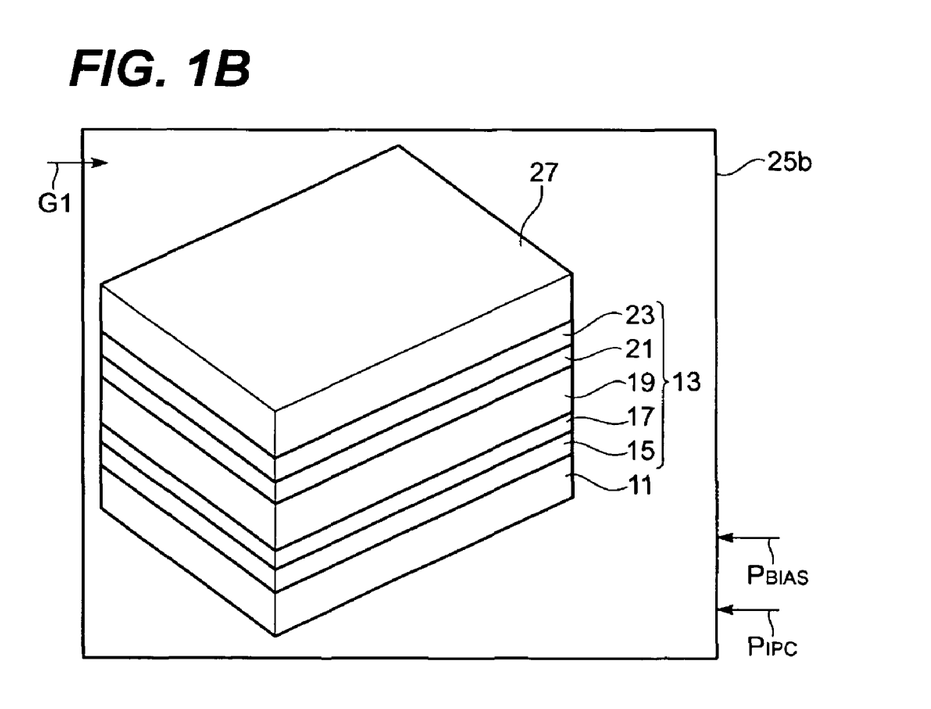
FIG. 1B shows a process to form a mask made of inorganic material on the semiconductor layers.

FIGS. 1A and 1B show the process to form a semiconductor optical device according to an embodiment of the present invention. The semiconductor optical device may be typically a semiconductor laser diode (hereafter denoted as LD). First, a semiconductor substrate 11 with a first conduction type is prepared. The substrate 11 may be made of group III-V compound semiconductor material; specifically the substrate 11 may be an n-type InP. Setting this substrate 11 in a growth furnace 25a, the process grows a semiconductor layer 13 on a surface 11a of the substrate 11. The layer 13 includes a plurality of semiconductor layers of a cladding layer 15 with the first conduction type, an active layer 17, another cladding layer 19 with the second conduction type, a contact layer 21 with the second conduction type, and a cap layer 23. The growth of these layers 13 may be carried out by the conventional organic metal vapor phase epitaxy (OMVPE) technique shown in FIG. 1A. The thickness of the layer 13 is preferably greater than 2 μm.

One example of the specific conditions of the layer 13 is shown in the table below:

TABLE I

Conditions for layer 13

| Layer | Conditions |
|---|---|
| Substrate 11 | n-type InP |
| First Cladding layer 15 | n-type InP |
| | t: 1.0 μm |
| Active layer 17 | InGaAsP MQW |
| | t: 0.2 μm |
| Second Cladding layer 19 | p-type InP |
| | t: 1.5 μm |
| Contact layer 21 | p-type InGaAs |
| | t: 0.2 μm |
| Cap layer 23 | p-type InP |
| | t: 0.1 μm |

The active layer 17 may have a band gap wavelength of 1.55 μm, at which the photoluminescence from the active layer becomes the maximum. Also, the active layer 17 may configure not only the multiple quantum well (MQW) layer but the single quantum well (SQW) and a bulk structure without any quantum wells. Moreover, the LD may provide guide layers between the active layer 17 and respective cladding layers, 15 and 19, which is often called as the separate confinement hetero-structure (SCH) layer. The LD above described may apply the substrate 11 in an upper portion thereof as the n-type cladding layer by omitting the first cladding layer 15.

Next, the process grows the silicon oxide layer 27 on the layer 13 with a thickness preferably greater than 2 μm and less than 3 μm by providing a source material G1 within the growth furnace. Because the thermal expansion co-efficient of the semiconductor layers, 11 and 13, and that of the inorganic film 27 made of silicon oxide are different from each other, the stress is inevitably induced within the inorganic film 27 and the semiconductor layer 13. In the present invention, the stress induced in the inorganic film 27 is preferably from −250 to −150 MPa at a temperature of 298 K (25° C.). When the stress induced in the inorganic film 27 is within the range above described, the stress at temperatures under which the second growth for the semiconductor layers to bury the mesa structure may become relatively small to prevent the breakage of the substrate 11 due to an excess stress. Moreover, the upper condition of the thickness of the layer 27, namely at most 3.0 μm is due to the controllability of the stress of the layer 27.

The induction coupled plasma enhanced chemical vapor deposition, which is often called as the ICP-CVD, may be applied to grow the inorganic film 27. The apparatus 25b schematically illustrated in FIG. 1B has a type of ICP-CVD apparatus. The ICP-CVD causes the induction coupled discharge to make the source gases 1 in a plasma state, which enhances the reaction between source gases G1. In the present embodiment, the source gases G1 include a mixture of tetra-ethoxy-silone and oxygen, which is often called as TEOS. Accordingly, the ICP-CVD may grow the layer in a relatively low temperature. For instance, the reaction temperature may be below 400° C. for a case when the substrate 11 is made of InP. The ICP-CVD may adjust the quality of the film to be grown by adjusting the bias condition applied to the substrate 11 during the growth. Thus, the ICP-CVD may grow a dense film with relatively less stress, accordingly, the ICP-CVD may grow the film with a thickness of around 10 μm. Because the grown film shows a low stress, it is hard for the film to be cracked. Other silicon organic material for the source gases are, for instance, tetra-ethoxy-fluoride-silane (TEFS: $Si(OC_2H_5)_3F$) or tri-methoxy-silane (HS: $(OCH_3)_3$). The table II below lists exemplary conditions to grow the inorganic film 27.

TABLE II

Conditions of inorganic film 27

| material | silicon oxide ($SiO_2$) |
|---|---|
| thickness [t] | 2 μm |
| source material | oxygen and tetra-ethoxy-silane |
| | TEOS: 10 sccm |
| | $O_2$: 500 sccm |
| | TEOS/$O_2$ = 1/20 |
| RF power | $P_{ICP}/P_{ETAS}$ = 700 W/100 W |
| Frequency | ICP/Bias = 13.56 MHz/400 kHz |
| Process Temperature | 200° C. |

Here, the ratio of the flow rate of the source gases may be TEOS: $O_2$=1:20 or greater.

Under the condition listed in the table for the growth of the inorganic film 27, it is preferable for the flow rate of the TEOS over 6 sccm to get a practical growth rate of the inorganic film, silicon oxide, of over 150 nm/min. The flow rate of the TEOS is preferably less than 15 sccm to get a dense film stably. Moreover, the flow rate of the oxygen is preferably greater than 300 sccm to accelerate the dissolution of the TEOS. The flow rate of the oxygen is preferably less than 600 sccm because the density of the silicon oxide film obtained by the process becomes stable. The inner pressure of the ICP-CVD furnace is higher than 0.1 Pa to get a practical growth rate, while, it is preferably less than 5 Pa to stabilize the density of the grown film.

Figure 2:
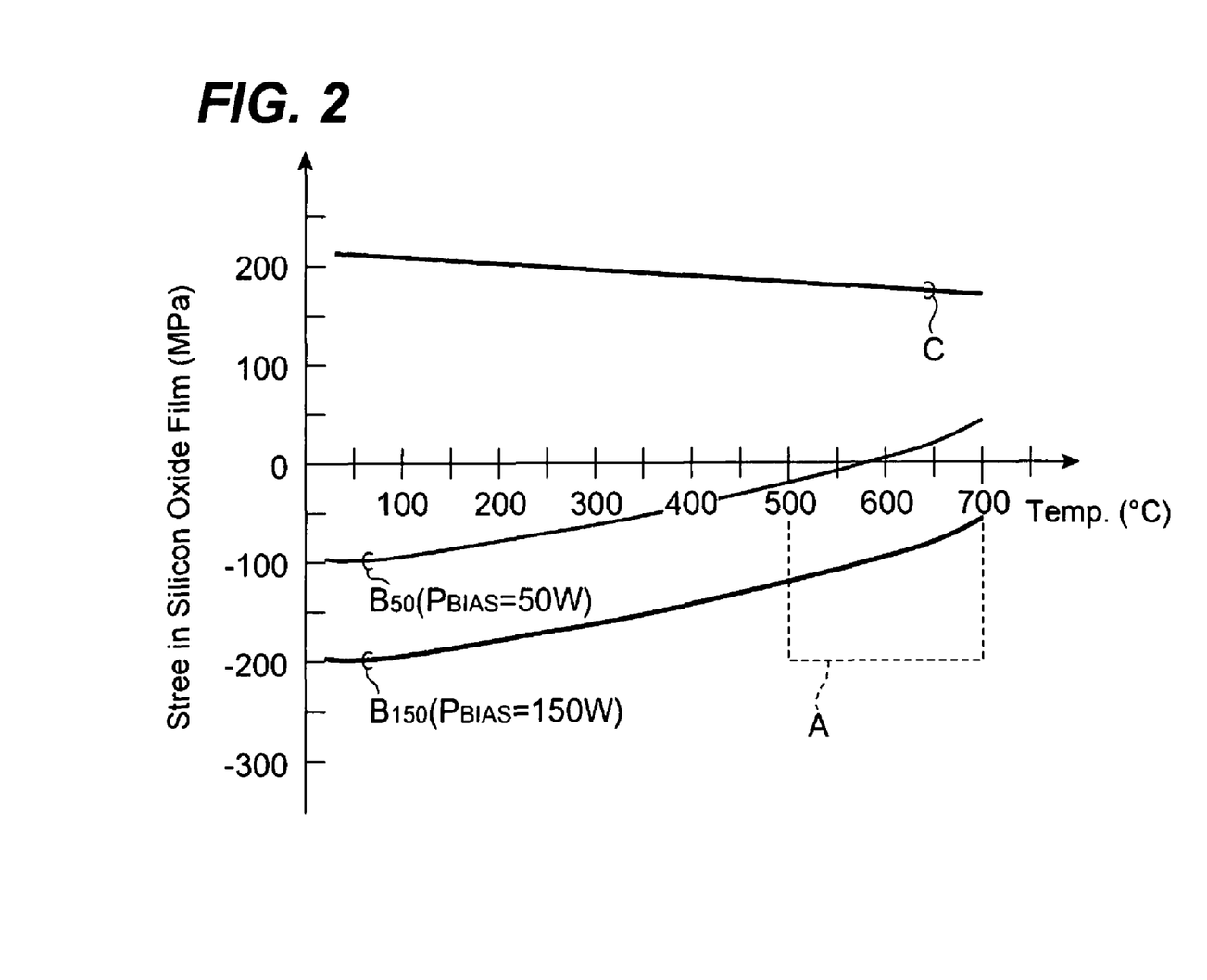
FIG. 2 shows a relation of the stress induced in the silicon oxide film formed by the ICP-CVD method against the process temperatures.

FIG. 2 explains experimental results of the stress induced within the silicon oxide film grown by the ICP-CVD apparatus with respect to temperatures. Here, the stress induced in the silicon oxide film was indirectly measured through a bend caused in a known semiconductor wafer on which the silicon oxide film was deposited. In FIG. 2, the positive stress corresponds to the tensile stress for the silicon oxide film, while, the negative sign denotes the compressive stress. The behavior $B_{50}$ shows a relation when the silicon oxide film was grown with a bias RF power of 50 W, while, $B_{150}$ shows a results when the film was grown with the bias RF power of 150 W. It is understood from the figure that, (1) the silicon oxide film grown under respective conditions, $B_{50}$ and $B_{150}$, show a positive temperature dependence, that is, the temperature co-efficient was in a range from +0.1 to +0.3 (MPa/T); (2) the stress induced within the film became smaller in the absolute value thereof as the temperature increased, that is, the stress reversed its characteristic from the compressive to the tensile at a certain temperature; and (3) the silicon oxide film grown in a lesser bias condition resulted in a smaller stress and the film grown in a greater bias condition indicated a larger compressive stress.

The behavior C in FIG. 2 shows a temperature dependence of the stress induced within the silicon nitride film, whose thickness was around 500 nm, grown on another p-CVD apparatus not provided with the induction coupled plasma function. The silicon nitride film indicated the tensile stress and the negative temperature co-efficient in the whole range of the temperatures.

From the results shown in FIG. 2, the silicon oxide film may be grown under a condition where the stress induced therein at temperatures from 500 to 700° C., which is the process temperature of the second growth for the burying region described below, became −200 to 100 MPa. Because the stress caused in the silicon oxide film is relatively small and the type of the stress is compressive, the peeling and the cracking of the mask formed by thus grown silicon oxide film may be prevented.

Figure 3A:
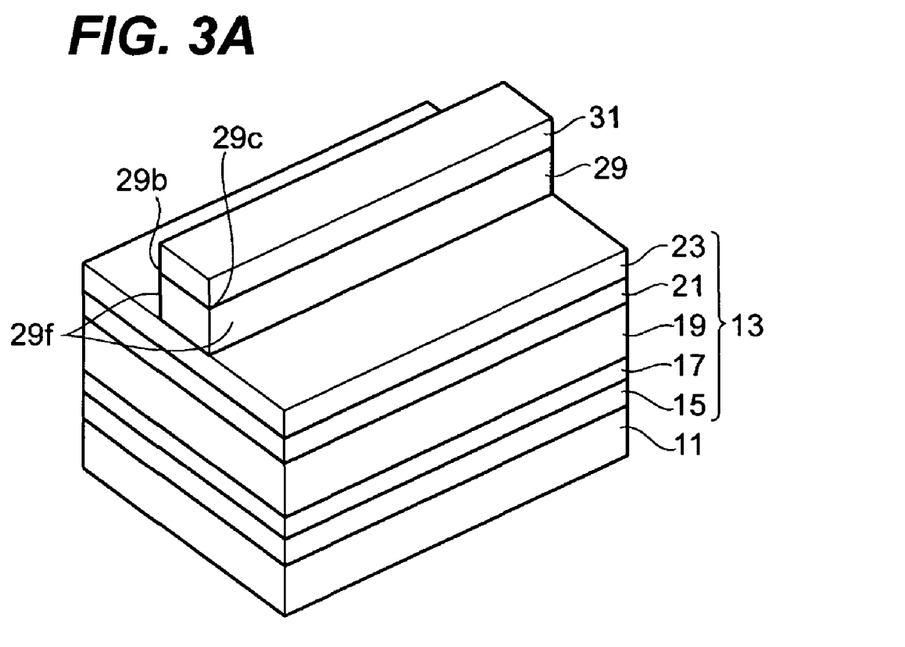
FIG. 3A shows a process to form a pattern of the silicon oxide mask.

The process to produce the semiconductor device will be further described below. In FIG. 3A, the process forms a mask 29 by patterning the silicon oxide film 27 grown under the condition described above. In FIG. 3A, the process forms a mask 29 by patterning the silicon oxide film 27 grown under the condition described above. First, a photo-resist 31 is patterned on the silicon oxide film 27. Dry-etching the film 27 by the photo-resist as the etching mask, the patterned mask 29 is obtained. This mask has a striped shape extending along a direction and having a width of 0.8 to 1.5 μm defined by the sides 29f and a thickness greater than 2 μm. The process removes the photo-resist pattern 31 after patterning the silicon oxide mask 29. Thus, the process according to the embodiment of the invention provides a mono-layered silicon oxide mask 29, without applying a multi-layered mask, to form the mesa structure and to bury this mesa structure by the second growth of the semiconductor layer.

Figure 3B:
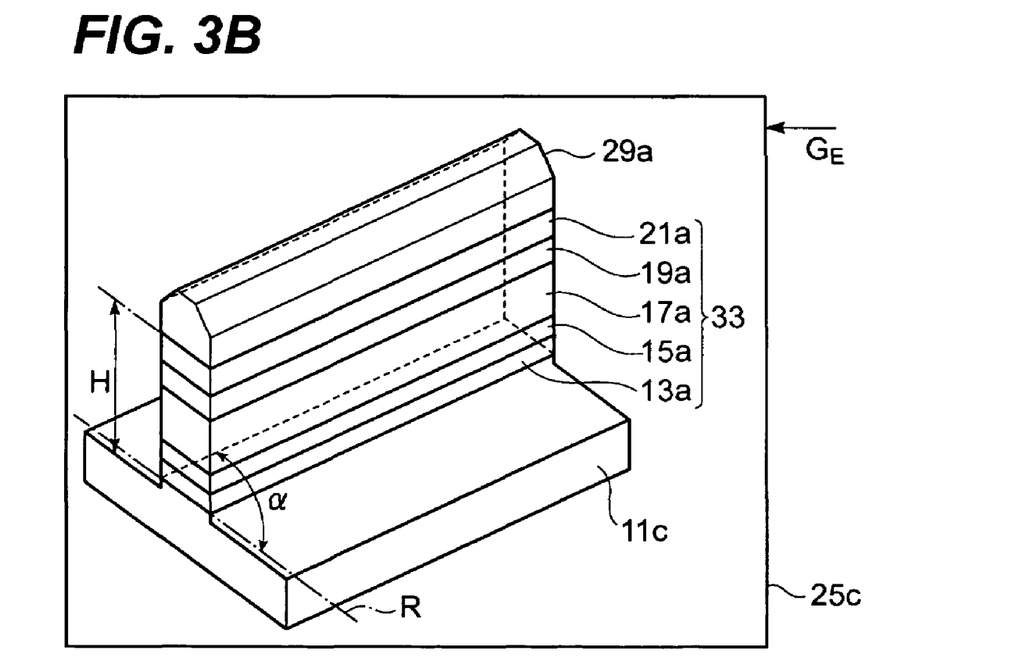
FIG. 3B shows a process to form a mesa structure.

Removing the photo-resist 31, the process sets the substrate within the etching chamber 25c (FIG. 3B). The mesa structure 33 for guiding light is formed by the dry-etching of the semiconductor layer 13. This etching is carried out until the active layer 17 exposes. The table below shows exemplary conditions of the dry-etching:

TABLE III

| Conditions of Dry-etching | |
| --- | --- |
| Reaction gas $G_E$ | mixture of $CH_4$ and $H_2$ |
| RF power | 100 W |

The dry-etching etches the corners, 29b and 29c, of the mask 29 to form the chamfered shape 29a and makes the sides of the mesa structure 33 in substantially perpendicular to the primary surface of the semiconductor layers 13. In an embodiment shown in FIG. 3B, the mesa structure 33 includes, on the n-type InP substrate 11c, the n-type InP cladding layer 13a, the InGaAsP active layer 15a, the p-type cladding layer 17a, the p-type InGaAs contact layer 19a, and the p-type InP cap layer 21a; and the mesa structure 33 has a height H of, for instance 4 μm, which is often called as the high-mesa structure. During the dry-etching for forming the high-mesa structure 33, the silicon oxide mask 29a does not cause cracks because of the compressive stress thereof.

As shown in FIG. 3B, the process may etch an upper portion of the substrate 11 to secure an enough thickness for the burying region to be formed in both sides of the mesa structure 33 in subsequent processes. Thus, the substrate 11 becomes a processed substrate 11c. In a case where the substrate 11 is then-type InP, the process may etch this substrate 11 at least 2 μm during the formation of the mesa structure 33. Moreover, the sides of the mesa structure 33 make a perpendicular angle to the primary surface of the substrate 11; that is, the angle α between the side of the mesa and the primary surface of the substrate 11c is preferably from 90° to 95°. Such a high-mesa structure may reduce the leak current flowing in the burying region formed in the subsequent process, which enhances the current confinement function within the active layer 17a in the mesa structure 33.

Figure 4A:
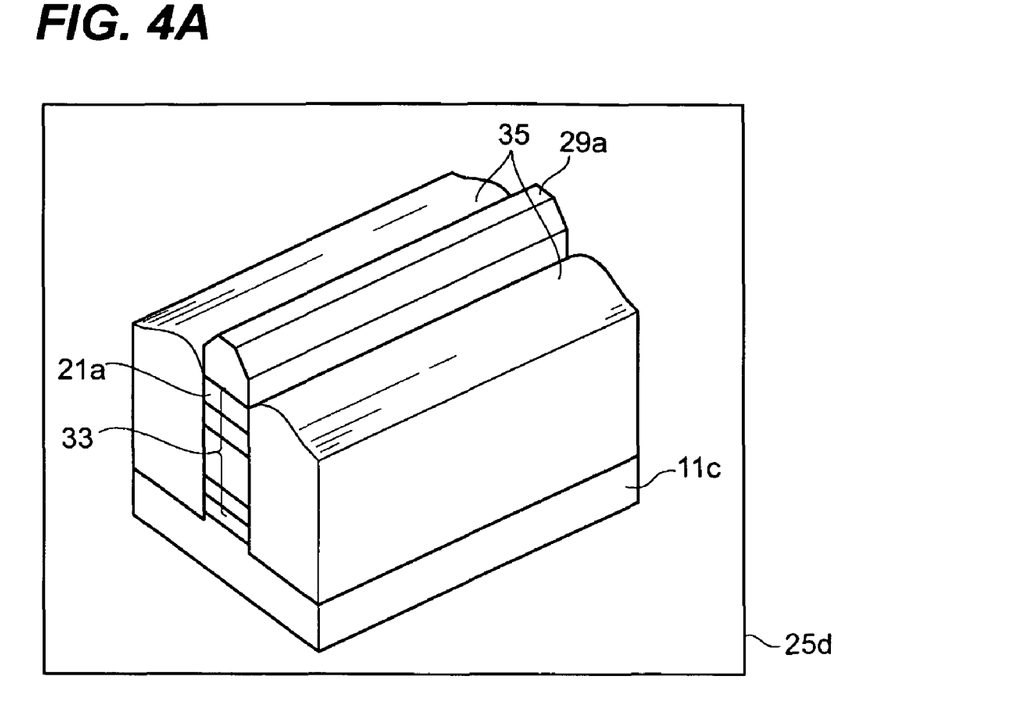
FIG. 4A shows a process to bury the semiconductor mesa by the burying regions.

FIG. 4A schematically illustrates a process to bury the mesa structure 33 by growing the semiconductor layer 35 in both sides of the mesa structure 33 so as to bury it. The OMVPE technique may grow the semiconductor layer 35. The burying region may be typically iron-doped InP, Fe—InP, which is grown at a temperature of 600° C. by supplying source gases of phosphine ($PH_3$), Tri-Methyl-Indium (TMI) and ferrocene ($Fe(C_2H_5)_2$) in the OMVPE furnace. The Fe—InP has a thickness of 4.2 μm and a doping concentration of $1 \times 10^{17}$ cm$^{-3}$ for iron (Fe), which shows a semi-insulating characteristic. The second growth of the burying region made of the Fe—InP by using the thicker film 29a as the mask, the abnormal growth on the mask 29a may be physically prevented by the thickness thereof. The growth temperature for the burying region is preferably higher than 500° C. and lower than 700° C. As described above, because the silicon oxide mask, 29 or 29a, is adjusted so as to have a small stress at the growth temperature, which may release the interface between the cap layer 21a and the silicon oxide mask 29a from the stress, the residual stress left in the mesa structure 33 after the second growth may be reduced. Preferably, the process may clean the surface of the semiconductor substrate 11 by the wet-etching in advance to the second growth for the burying region.

Figure 5A:
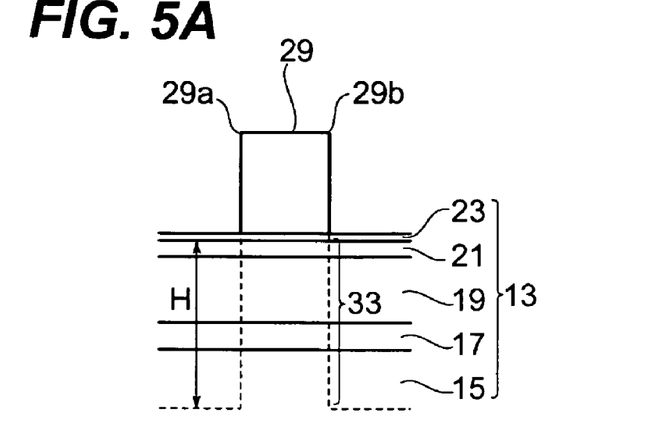
FIGS. 5A and 5B show cross sections of the mesa structure and the burying regions.
Figure 5B:
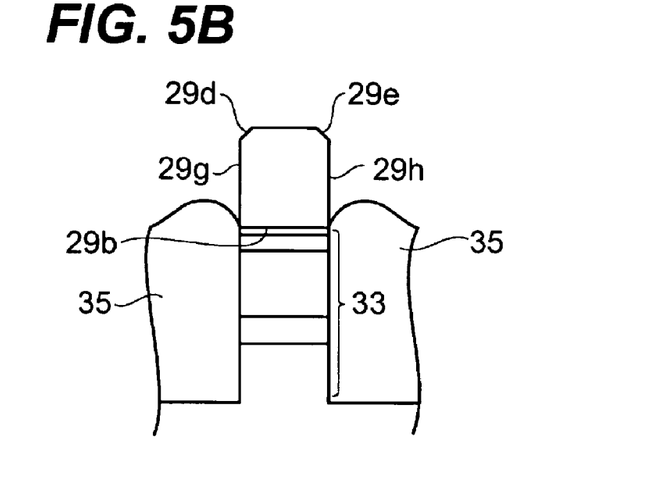
Figure 5C:
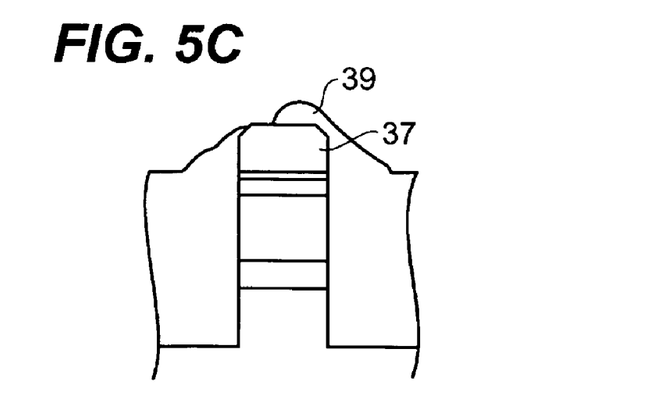
FIG. 5C shows an example of the abnormal growth on the mask.

The second growth for the burying region will be further described as referring to FIGS. 5A to 5C. As schematically illustrated in FIG. 5A, the dry-etching to form the mesa structure 33 deforms the mask 29, in particular, the corners, 29a and 29b, are chamfered to form the diagonal surfaces, 29d and 29e, which means that the sides, 29g and 29h, perpendicular to the primary surface of the semiconductor layer 13 decreases the height thereof. As shown in FIG. 5B, the burying region does not grow on the silicon oxide mask 29a and the sides, 29g and 29h, of the mask 29 are substantially perpendicular to the primary surface of the semiconductor layer 13. Excess sources not consumed on the top portion of the mask 29 falls in both sides of the mask 29a to form banks there; accordingly, the burying region 35 becomes slightly thicker. According to the process of the present embodiment, even the mesa structure 33 includes the contact layer, which further increases the height of the mesa structure 33, the abnormal growth of the burying region 39 so as to cover or to bury the mask 37, as shown in FIG. 5C, does not occur. Moreover, as already explained, the mask 29a formed by the IPC-CVD technique may reduce the stress induced in the underlying semiconductor layers.

Figure 4B:
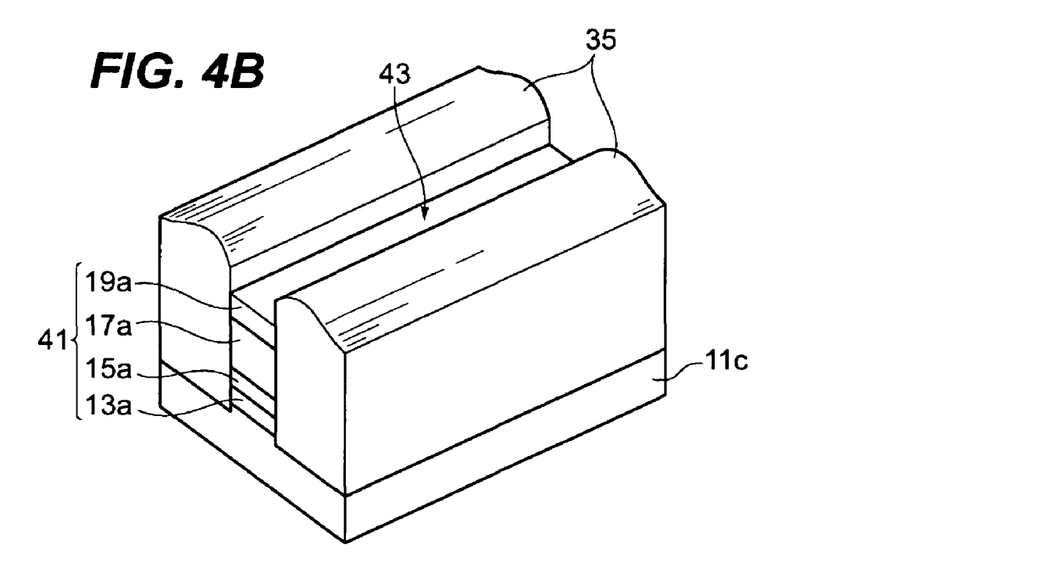
FIG. 4B shows a process to remove the silicon oxide mask and the cap layer on the top of the mesa structure.

Referring to FIG. 4B, the process removes the mask 29a after the second growth for the burying region 35. A fluoric acid diluted by 25% may solve the silicon oxide mask 29a without degrading the underlying layers. Moreover, the InP cap layer 21a on the top of the mesa 13 is also removed by an etchant containing hydrochloric acid to expose the top of the contact layer 19a. Thus, the semiconductor stripe 41 that includes the n-type InP cladding layer 13a, the active layer 15a, the p-type cladding layer 17a and the p-type contact layer 19a is formed so as to leave the groove 43. Because the stress induced from the inorganic film 29a to the underlying layer 43 during the second growth for the burying region at a high temperature is reduced, the residual stress in the stripe 41 may be reduced. Accordingly, even after the removal of the mask 29a, the buried hetero structure shown in FIG. 4B may be obtained with lesser internal stress in the room temperature. Moreover, the burying region, the Fe-doped InP, has a thermal expansion co-efficient substantially equal to the stripe 41, which may stabilize the hetero-interface in the stripe 41; accordingly, the reliability of the device may be improved.

As already described, a region denoted by the symbol "A" in FIG. 2 indicates preferable conditions for the silicon oxide mask used in the second growth for the burying region. When the silicon oxide mask shows a tensile stress, the mask is easily cracked. Specifically, the silicon oxide mask 29a preferably has a stress from −200 to 100 MPa at temperatures from 500 to 700° C. The silicon oxide mask grown under a condition above shows a lesser stress, the burying region may be grown in both sides of the mesa as lesser internal stress.

Figure 6A:
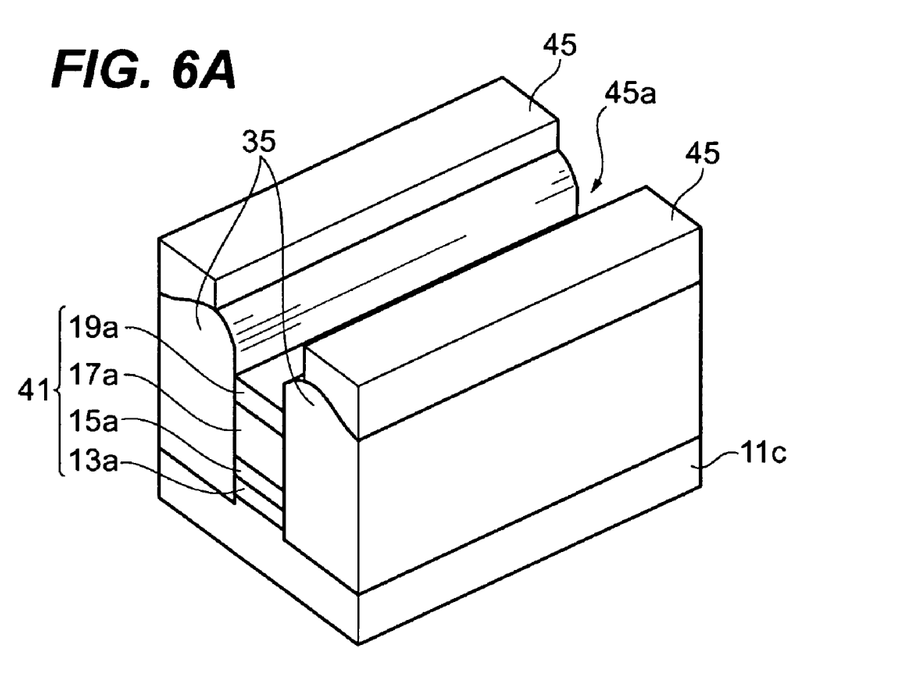
FIG. 6A shows a process to form a cover layer on that covers the burying region so as to expose the top of the mesa structure.
Figure 6B:
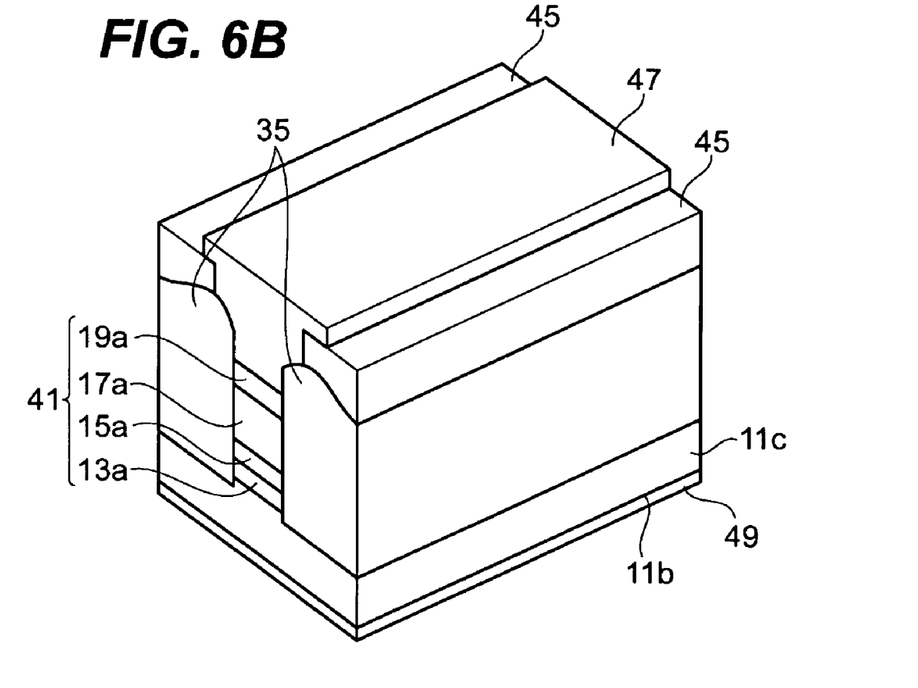
FIG. 6B shows a process to form the electrode.

Subsequent to the process shown in FIG. 4B, an insulating layer 45 made of, for instance, silicon oxide, is formed on the burying region 35. This insulating layer 45 provides an opening 45a aligned with the groove 43. On the insulating layer 45 and in the groove 43 is formed with the electrode 47, the anode electrode, so as to come in contact with the contact layer 19a, while, the back surface 11b of the substrate 11 is formed with the other electrode 49, the cathode electrode, to complete the device (FIG. 6B).

In a case where the mesa has a considerable height, in particular, when the mesa includes the contact layer, occasionally further includes the cap layer, the height thereof becomes greater such that the abnormality is likely to be occurred during the growth of the burying region, in particular, the abnormal growth frequently occurs when the height exceeds 2 μm. In order to bury the mesa with a height thereof exceeding 3 μm without causing the abnormal growth, the sides of the silicon oxide mask in a portion perpendicular to the primary surface of the substrate is necessary to be at least 0.7 μm. When the height of the mesa reaches around 3.5 μm, at least 1 μm height for the perpendicular sides is necessary for the silicon oxide mask.

Because the perpendicular sides of the silicon oxide mask with an effective height, which is the silicon oxide grown from TEOS, may prevent the abnormal growth during the second growth for the burying region of InP. Accordingly, the present method may be effective for the abnormal growth accidentally occurred in a case where the mesa has a relatively lower height. Moreover, the control of the abnormal growth results in the reproducibility and the homogeneity of the mesa and the burying region.

Preferable embodiments described above forms the silicon oxide mask on the semiconductor stack with a stress from −250 to −150 MPa (compressive stress) at a room temperature by the IPC-CVD apparatus, which enables to prevent the crack and the peel even when the silicon oxide film is placed in the room temperature. Moreover, the IPC-CVD apparatus may adjust the residual stress at a temperature around 600° C., which is a process temperature of the second grown for the burying region, to be from −200 to 100 MPa. Thus, the reliability of the device increases because the stress induced within the silicon oxide mask at the second growth may be decreased. The thicker mask may be also tolerant for the dry-etching to form the mesa structure, which releases the process to prepare a mask with double or more layers.

While the preferred embodiments of the present invention have been described in detail above, many changes to those embodiments may be made without departing from the true scope and teachings of the present invention. The embodiments described above concentrate of the semiconductor laser diode, however, the invention may be applicable to the semiconductor optical modulator, or devices integrating the laser diode with the modulator. The present invention, therefore, is limited only as claimed below and the equivalents thereof.

What is claimed is:

1. A method to form a semiconductor optical device, comprising:

growing a stack on a semiconductor substrate, said stack including a plurality of semiconductor layers each made of group III-V compound semiconductor material;

forming a silicon oxide film with a thickness greater than 2 μm on said stack by using an induction coupled plasma enhanced chemical vapor deposition apparatus to apply bias power to said semiconductor substrate;

patterning said silicon oxide film;

dry-etching said stack with said patterned silicon oxide film as an etching mask to form a semiconductor mesa structure; and growing a burying region made of group III-V compound semiconductor material in a growth temperature from 500 to 700° C. so as to bury said semiconductor mesa structure, wherein said silicon oxide film has a stress from −250 to −150 MPa at a room temperature, a stress greater than −200 MPa and less than 100 MPa in said growth temperature, and a positive temperature co-efficient of stress in a range from said room temperature to said growth temperature.

2. The method according to claim 1,
wherein said stack has a thickness greater than 1.5 μm, and
wherein said dry-etching process to form said mesa structure etches said semiconductor substrate at least 2 μm substantially perpendicular to a primary surface of said semiconductor substrate.

3. The method according to claim 2,
wherein said growth of said burying region is carried out such that said burying region fully covers both sides of said mesa structure and a surface of said semiconductor substrate exposed by said dry-etching.

4. The method according to claim 1,
wherein said induction-coupling plasma enhanced chemical vapor deposition apparatus supplies a silicon organic material and oxygen as source materials for said silicon oxide film.

5. The method according to claim 1,
wherein said process to grow said stack includes a sequential growth of an InP layer with a first conduction type, an active layer, an InP layer with a second conduction type different from said first conduction type, a GaInAs layer with said second conduction type, and an InP cap layer, and
wherein said process to dry-etch said stack includes a sequential etching of said InP cap layer, said GaInAs layer with said second conduction type, said InP layer with said second conduction type, said active layer, and said InP layer with said first conduction type.

6. The method according to claim 5,
further comprising steps of, after said step of growing said burying region:
removing said patterned silicon oxide film and said InP cap layer after said process to grow said burying region to expose said GaInAs layer with said second conduction type, and
forming an electrode on said exposed GaInAs layer.

7. The method according to claim 1,
wherein said group III-V compound semiconductor material of said burying region is an InP doped with iron (Fe).

* * * * *